US012732204B2

(12) United States Patent
Janosik et al.

(10) Patent No.: US 12,732,204 B2
(45) Date of Patent: Sep. 8, 2026

(54) MOTOR VOLTAGE RECONSTRUCTION BY ADC OVERSAMPLING AND AVERAGING

(71) Applicant: NXP USA, Inc., Austin, TX (US)

(72) Inventors: Jozef Janosik, Oscadnica (SK); Marek Musak, Pruzina (SK); Tomas Fedor, Svedernik (SK)

(73) Assignee: NXP USA, Inc., Austin, TX (US)

( * ) Notice: Subject to any disclaimer, the term of this patent is extended or adjusted under 35 U.S.C. 154(b) by 186 days.

(21) Appl. No.: 18/650,544

(22) Filed: Apr. 30, 2024

(65) Prior Publication Data

US 2025/0337430 A1 Oct. 30, 2025

(51) Int. Cl.
*H03M 1/48* (2006.01)
*H02P 27/08* (2006.01)
*H03M 1/12* (2006.01)

(52) U.S. Cl.
CPC ............ *H03M 1/125* (2013.01); *H02P 27/08* (2013.01); *H03M 1/121* (2013.01)

(58) Field of Classification Search
CPC ........ H02P 27/08; H02P 27/14; H02P 27/045; H02P 27/06; H03M 1/125
USPC ......................... 341/155, 111, 112, 116, 117
See application file for complete search history.

(56) References Cited

U.S. PATENT DOCUMENTS 8,354,809 B2 1/2013 Mehlhorn et al.
9,584,043 B2 2/2017 Zhang et al.
2013/0154588 A1* 6/2013 Gilliom ................. H02M 3/158 323/267
2020/0313589 A1 10/2020 Chen et al.
2023/0170835 A1 6/2023 Pacha
2023/0387841 A1* 11/2023 Tan ......................... H02P 27/08

OTHER PUBLICATIONS

M. Coppola et al.: "Fault detection via on-line parameter estimation for a strong variable parameters PM brushless machine", 2016 International Symposium on Power Electronics, Electrical Drives, Automation and Motion (SPEEDAM), IEEE, Jun. 22, 2016, pp. 365-370.

Xuan Wu et al.: "Equivalent Three-Vector-Based Model Predictive Control With Duty-Cycle Reconstruction for PMSM" IEEE Transactions on Industrial Electronics, IEEE Service Center, Piscataway, NJ, USA, vol. 71, No. 3, May 1, 2023, pp. 2395-2404.

Peretti et al., "FPGA-Based Voltage Measurements in AC Drives," XIX International Conference on Electrical Machines—ICEM 2010, Rome; 6 pages.

Yang et al., "Online Detection of Inverter Voltage Error Based on the Voltage Oversampling Measurement and Sigmoidal Function Model," IEEE Transactions on Power Electronics, vol. 37, No. 1, Jan. 2022, pp. 303-312; 10 pages.

* cited by examiner

*Primary Examiner* — Peguy Jean Pierre

(57) ABSTRACT

A method for motor voltage reconstruction by Analog to Digital Converter (ADC) oversampling and averaging includes measuring a first phase voltage with an ADC, the first phase voltage proportional to a first duty cycle of a first Pulse Width Modulation (PWM) signal. A second phase voltage is measured with the ADC, the second phase voltage proportional to a second duty cycle of a second PWM signal, wherein the first PWM signal and the second PWM signal control consecutive phases of a three-phase motor. A third duty cycle of a third PWM signal of the three-phase motor is reconstructing from the first phase voltage and the second phase voltage.

20 Claims, 10 Drawing Sheets

MOTOR VOLTAGE RECONSTRUCTION BY ADC OVERSAMPLING AND AVERAGING

FIELD

This disclosure relates generally to three-phase motors, and more specifically to motor voltage plausibility verification of a three-phase motor.

BACKGROUND

In safety motor control applications, parameters such as motor speed, position, current or torque need to be verified to ensure these parameters are plausible. For example, parameters that fall outside of an expected range may indicate an anomalous condition that may require prevention or reversal of the motor drive operation. In one example, an automotive motorized window, a door apparatus or a sunroof may close automatically thus presenting a risk for trapping, squeezing or injuring a person. In addition, a pinch algorithm used to guard against this risk of trapping may malfunction due to an erroneous current reading.

In one example, the three motor phase currents of a three-phase motor are measured. Based on symmetry, the sum of all three currents should equal zero, otherwise a fault is determined. For systems employing single or dual shunts (e.g., measuring less than all three phases), the motor phase currents that are not directly measured may be reconstructed or calculated. However, motor symmetry cannot be used for a plausibility check of current. In this case, a Back Electro-Motive Force (BEMF) observer may be used for a plausibility check of motor currents, where the BEMF is calculated from motor speed, measured currents and required motor voltages. However, the required motor voltage remains unverified and also needs to be checked for plausibility.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for motor voltage reconstruction in an alpha-beta reference frame for Micro-Controller Unit (MCU) controlled Field Oriented Control (FOC) motor applications with motor voltage plausibility checks. These checks may be used for safety applications although may be used independently for motor voltage verification or any application containing an inverter for inverter output voltage reconstruction. This disclosure also applies to single-shunt, dual-shunt or triple-shunt three-phase applications. The embodiments of this disclosure reduce the number of MCU external components, MCU utilization and the amount of safety-grade software blocks, while checking for plausibility of the entire system chain from required alpha-beta voltages through to the inverter output terminals.

The motor voltage plausibility check requires a measurement of a motor phase voltage of a discrete Pulse Width Modulation (PWM) signal and reconstruction of the voltage back to a continuous domain. This typically involves an edge-capture hardware setup, (with signal conditioning circuitry), or an oversampling approach which requires voltage dividers for Direct Current (DC) Bus voltage and motor voltage measurement. These outputs are oversampled and then an average voltage value per PWM period is calculated.

This approach either requires additional hardware (e.g., edge capturing), or more computation power and an additional signal processing algorithm for oversampling. The disclosed approach only requires one multiplexed ADC for actual phase voltage measurement of two consecutive phases of an inverter with the third phase reconstructed from the two phases that are measured. In one embodiment, another ADC can be added for better reconstruction accuracy for actual DC Bus voltage measurement. By using the ADC with oversampling and hardware averaging for current measurements, the MCU may be offloaded and not be required for computing the respective average current values. In the embodiments of this disclosure, a Central Processing Unit (CPU) may be used instead of the MCU.

Figure 1:
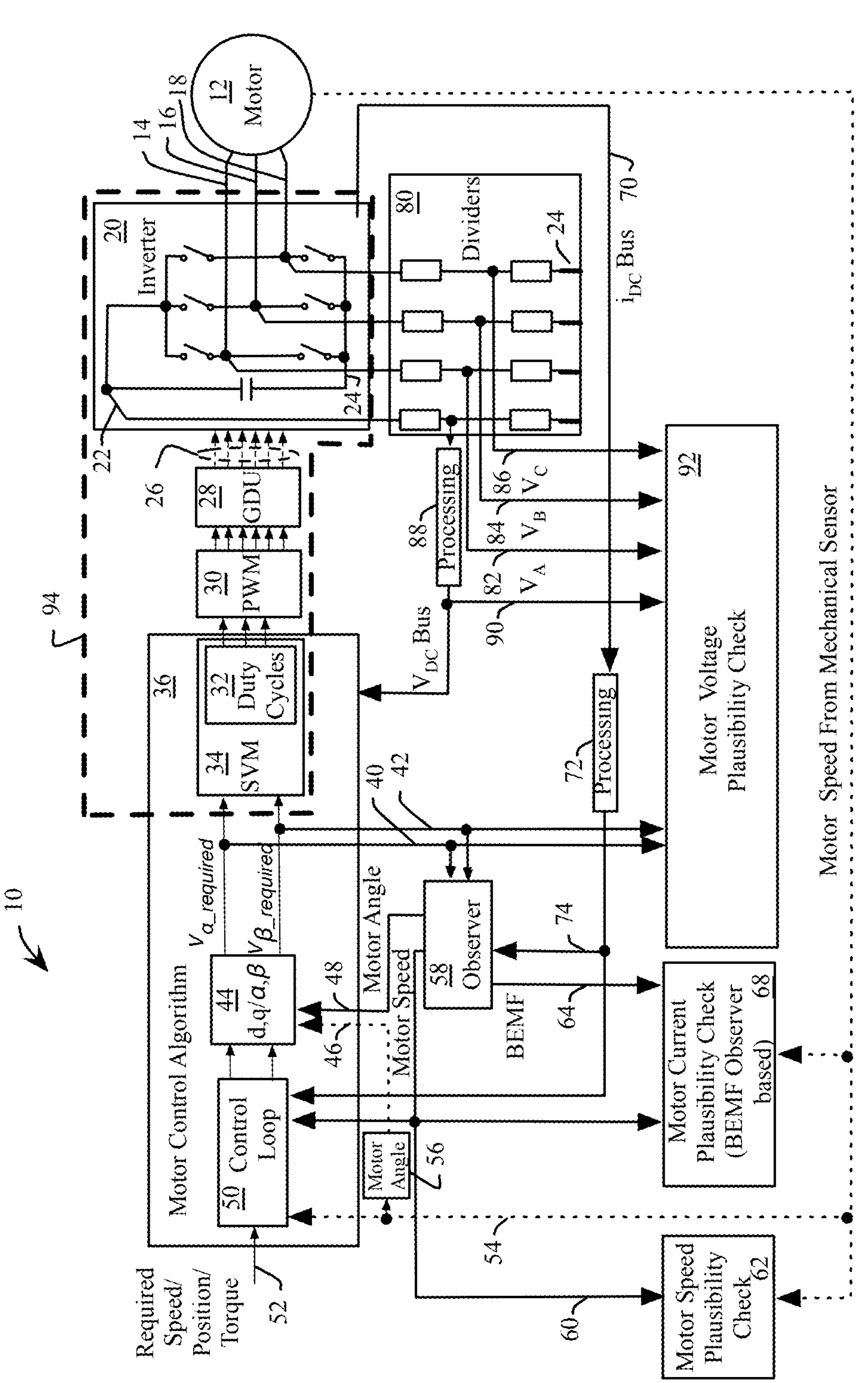
FIG. 1 is a schematic view of a system for motor voltage reconstruction by Analog to Digital Convertor (ADC) oversampling and averaging, in accordance with an embodiment of the present disclosure.

FIG. 1 shows an embodiment 10 of a system for motor voltage reconstruction by ADC oversampling and averaging. The embodiment 10 controls a three-phase motor 12 with three motor phase voltages 14, 16 and 18 generated by an inverter 20 operating between a power 22 and ground 24 network. The inverter 20 receives a plurality of signals 26 from a Gate Drive Unit (GDU) 28. The signals 26 control the three high-side and three low-side switches of the inverter 20 to generate the motor phase voltages 14, 16 and 18. The GDU 28 receives PWM signals from a PWM circuit 30. The PWM circuit 30 receives inputs from a Duty Cycles circuit 32, which is part of a Space Vector Modulation (SVM) circuit 34. The SVM circuit 34 is part of a motor control algorithm module 36.

The SVM circuit 34 generates three PWM signals in response to a required alpha voltage 40 and a required beta voltage 42, generated in an alpha-beta reference frame with an inverse Park transform 44. The inverse Park transform 44 receives either a motor angle 46 (derived from a motor speed 54 sensed by a mechanical sensor), or a motor angle 48 (derived from the observer 58) and inputs from a control loop 50. Depending upon the application using the embodiment 10, the inverse Park transform 44 will use only one of the motor angle 46 or 48. The control loop 50 receives a required speed/position/torque signal 52. Depending upon the application using the embodiment 10, the control loop 50 will also use a motor speed 54 from a mechanical sensor or a motor speed 60 from the observer 58. The motor control algorithm module 36 includes the SVM 34, the inverse Park transform 44 and the control loop 50.

The embodiment 10 includes an observer 58, which may be used for motor current plausibility checking based on an observed BEMF derived from motor speed, measured currents and required motor voltages 40 and 42. The observer 58 may send the motor speed 60 to a motor speed plausibility check 62. The observer 58 may also send the BEMF 64 and the motor speed 60 to a motor current plausibility check 68. A current signal 70 from the inverter 20 may be processed with a processing circuit 72, then sent as a processed current signal 74 to the observer 58 and the control loop 50. Use of the measured or observed actual speed and angle for current plausibility and control loop feedback depends upon the application using the embodiment 10.

A divider circuit 80 uses voltage division to scale down the motor phase voltages 14, 16 and 18 to produce the respective motor phase voltages Va 82, Vb 84 and Vc 86. The voltage of the power network 22 is similarly scaled and processed (e.g., filtered), by a processing circuit 88 to produce a DC bus voltage Vdcb 90. A motor voltage plausiblity check 92 receives the motor phase voltages 82, 84 and 86, the DC bus voltage 90, and the required alpha and beta voltages 40 and 42. In one embodiment, two consecutive phases of the three phases of the motor 12 are oversampled and averaged to produce a respective phase voltage. The phase voltages may be used to determine duty cycles of the respective phases. The duty cycle of the third phase may then be determined and converted to a respective phase voltage. The three resulting phase voltages may then be converted to reconstructed alpha and beta voltages in the alpha-beta reference frame, with a Clarke transform. In one embodiment, an absolute value of a difference between the reconstructed alpha voltage and the required alpha voltage 40 is compared to a predefined threshold. If the difference is less than the threshold, then it is determined that the reconstructed alpha voltage is plausible. Similarly, an absolute value of a difference between the reconstructed beta voltage and the required beta voltage 42 is compared to a predefined threshold. If the difference is less than the threshold, then it is determined that the reconstructed beta voltage is plausible. In so doing, the entire signal chain 94 between the output of the motor control algorithm module 36 and the motor 12 (including the SVM 34, PWM 30, GDU 28 and the inverter 20) is checked for plausibility. In one embodiment, the motor voltage plausibility check 92 may be used in cooperation with motor current plausibility check 68. In another embodiment, the motor voltage plausibility check 92 may be used independently to provide information on whether the actual motor voltages follow the required alpha and beta voltages 40 and 42.

Figure 2:
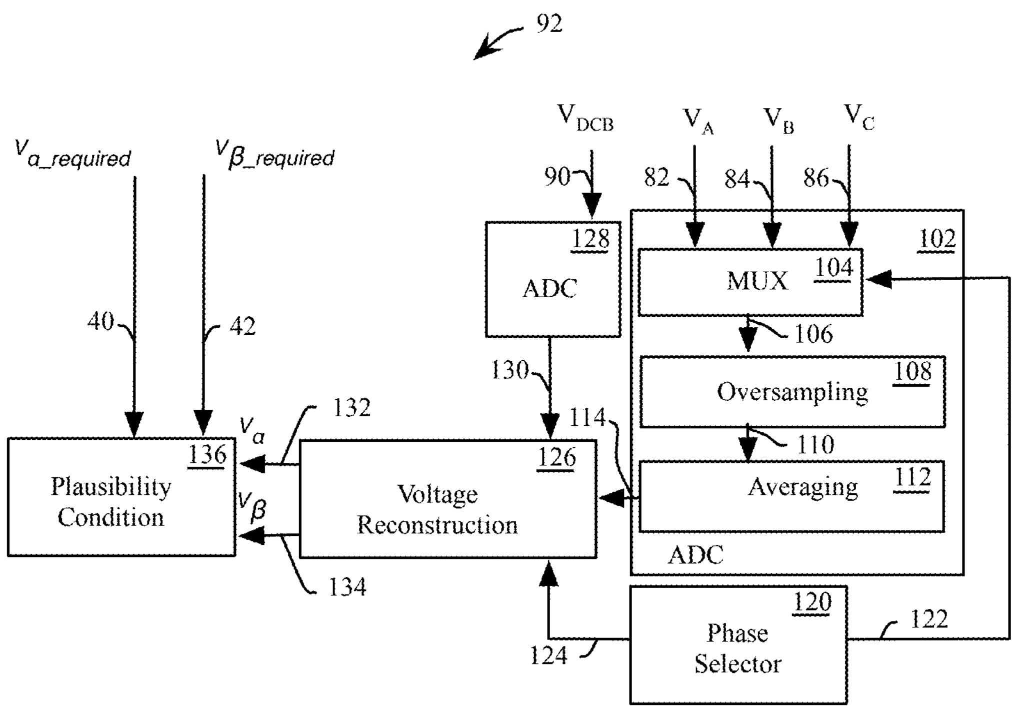
FIG. 2 is a schematic view of a circuit for motor voltage plausibility check in accordance with the embodiment of FIG. 1.

FIG. 2 shows the embodiment 92 of a motor voltage plausibility check used with the embodiment 10 of FIG. 1. With continued reference to FIG. 1, the embodiment 92 of FIG. 2 includes an ADC 102. The ADC 102 includes a Mux 104 configured to generate a signal 106 from one of the motor phase voltages 82, 84 and 86. The signal 106 is oversampled with a sampler circuit 108 to produce a signal 110. The signal 110 is averaged with an averaging circuit 112 to produce a signal 114. A phase selector 120 controls the input selection of the mux 104, and motor phase selection 124 for the voltage reconstruction circuit 126. In one embodiment a conversion between motor phase voltages and PWM duty cycle requires the DC bus voltage 90. In another embodiment phase voltage reconstruction accuracy may be improved by using a measured DC bus voltage 90, measured with a second ADC 128 to generate an actual DC bus voltage 130. The voltage reconstruction circuit 126 generates a reconstructed alpha voltage 132 and a reconstructed beta voltage 134. A plausibility condition circuit 136 compares a difference between the reconstructed alpha voltage 132 and the required alpha voltage 40 against a threshold. Similarly a difference between the reconstructed beta voltage 134 and the required beta voltage 42 is compared to another threshold. If neither threshold is exceeded, the voltage conditions in the alpha-beta reference frame are deemed plausible, hence the motor 12 is allowed to continue to operate.

Figures 3, 4, 5:
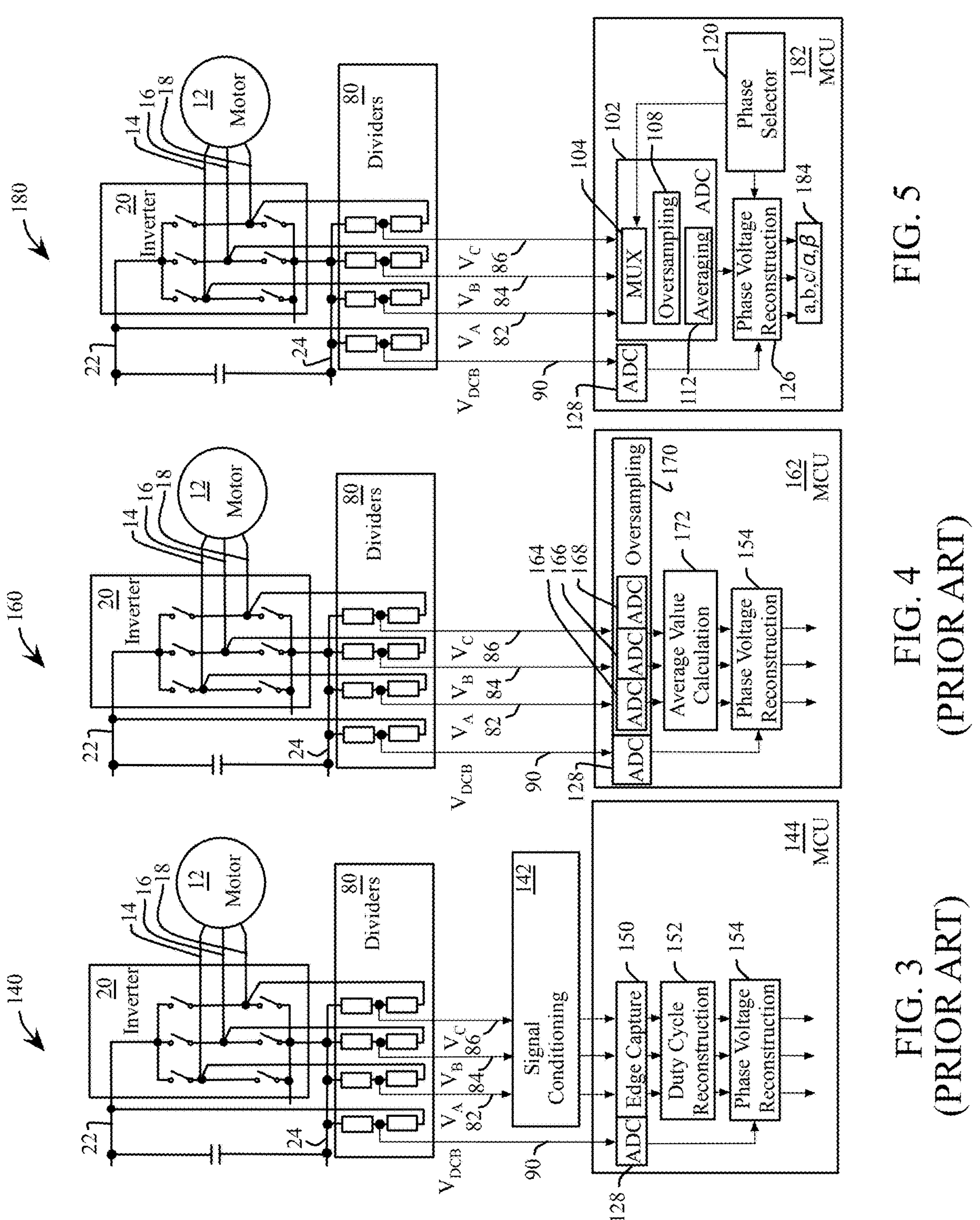
FIG. 3 is a schematic view of an embodiment of a circuit for phase voltage reconstruction.
FIG. 4 is a schematic view of another embodiment of a circuit for phase voltage reconstruction.
FIG. 5 is a schematic view of a circuit for phase voltage reconstruction, in accordance with an embodiment of the present disclosure.

FIG. 3, FIG. 4 and FIG. 5 show three different embodiments of circuits for phase voltage reconstruction. With reference to FIG. 3, an embodiment 140 provides voltage reconstruction based on pulse-length measurement of the PWM signals controlling the motor 12. The phase voltage is reconstructed as a ratio of the respective PWM pulse length to the PWM period. This solution requires additional hardware (e.g., analog comparators and voltage dividers). With continued reference to FIG. 1, the embodiment 140 of FIG. 3 includes a signal conditioning circuit 142 to condition (e.g., filter) the motor phase voltages 82, 84 and 86. The embodiment 140 includes an MCU 144. The MCU 144 receives the conditioned motor phase voltages from the signal conditioning circuit 143 and captures the edges of the PWM signals with an edge capture module 150. The respective duty cycle of each PWM of each of the three phases of motor 12 is reconstructed with the duty cycle reconstruction module 152. The motor phase voltages are then reconstructed with a phase voltage reconstruction circuit 154 using the duty cycles from the duty cycle reconstruction module 152 and the DC bus voltage 90, (or alternatively from the converted DC bus voltage from the ADC 128.

With reference to FIG. 4, an embodiment 160 provides voltage reconstruction based on oversampling with one ADC required for each motor phase voltage to be measured. The average value of the oversampled data is calculated by an algorithm in an MCU, where the oversampled values need to be stored in an accumulator until processed. With continued reference to FIG. 1, the embodiment 160 of FIG. 4 includes ADCs 164, 166 and 168 for converting motor phase voltages 82, 84 and 86 respectively. Each ADC 164, 166 and 168 oversamples their respective inputs with an oversampling circuit 170 with results stored in an accumulator of an MCU 162. The average value of the oversampled data from each ADC 164, 166 and 168 is calculated with an average value calculator 172. The motor phase voltage values are then reconstructed from the average values with a phase voltage reconstruction circuit 154.

With reference to FIG. 5, an embodiment 180 oversamples motor phase voltages individually using a multiplexed ADC. After a given number of samples (e.g., in one example, the samples spanning a full PWM period), the ADC automatically calculates an average value and makes this average available to the MCU, thereby offloading the MCU. Two consecutive phases are measured, while the third phase is reconstructed, hence the current control loop frequency is half of the PWM frequency. Accordingly, the output of the current controller remains constant for two consecutive PWM cycles. This allows for having all three motor phase voltages (and in turn alpha-beta voltages) measured, reconstructed and made available for voltage plausibility checking in each current control loop cycle. With continued reference to FIG. 1 and FIG. 2, the embodiment 180 of FIG. 5 includes an MCU 182 with the ADC 102, multiplexer 104, oversampling circuit 108, averaging circuit 112, phase selector 120 and phase voltage reconstruction circuit 126, as shown in FIG. 2 The embodiment 180 further includes a Clarke transform 184 for converting the motor phase voltages from the three-phase stationary reference frame (a,b,c) to the two-phase stationary reference frame (e.g., alpha-beta reference frame).

Figure 6:
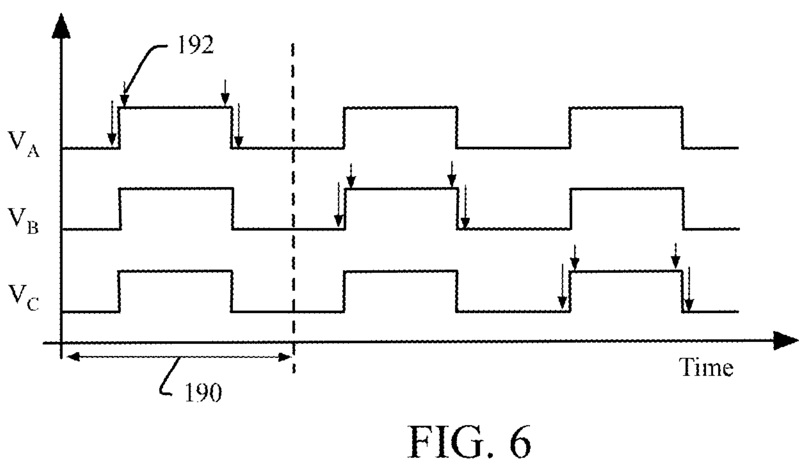
FIG. 6 is a graphical view of an embodiment of a method for oversampling Pulse Width Modulation (PWM) signals used to control a three-phase motor.
Figure 7:
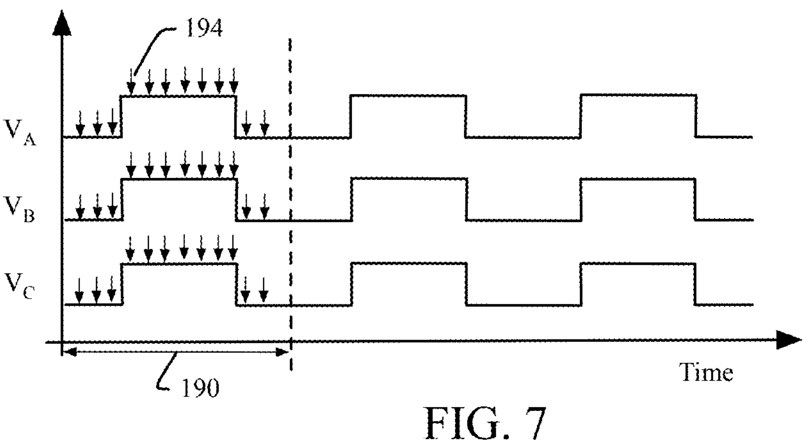
FIG. 7 is a graphical view of another embodiment of a method for oversampling Pulse Width Modulation (PWM) signals used to control a three-phase motor.
Figure 8:
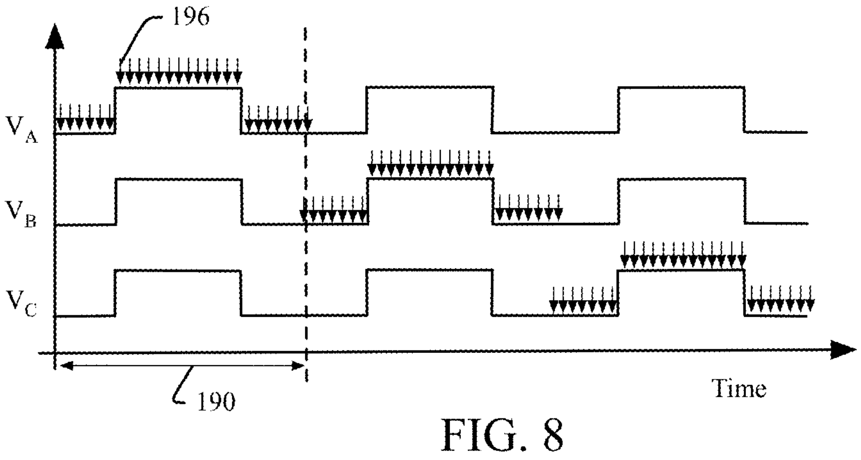
FIG. 8 is a graphical view of another embodiment of a method for oversampling Pulse Width Modulation (PWM) signals used to control a three-phase motor.

FIG. 6, FIG. 7 and FIG. 8 show three different embodiments for oversampling a PWM signal used to control a three-phase motor. With reference to FIG. 6, with a PWM period 190, sampling with samples 192 only occurs around the expected timing of rising and falling edges of the PWM pulse. This method relies upon edge detection, resulting in low resolution for voltage monitoring. This method also does not monitor voltage changes outside of the expected rising and falling edge intervals of the PWM pulse and precludes the use of averaging.

With reference to FIG. 4 and FIG. 7, oversampling with samples 194 occurs for all three PWM pulses concurrently. Although all three PWM voltages may be oversampled in one PWM period 190, the resolution per phase is reduced to the PWM period divided by three times the ADC conversion rate. The required computation by the MCU 162 of FIG. 4 is increased and ADC averaging is precluded.

With reference to FIG. 8, oversampling with samples 196 uses cyclical phase voltage oversampling in three consecutive PWM periods, with one phase voltage oversampled per PWM period. This method provided the best oversampling resolution and may use an ADC averaging function (thus offloading the MCU). However, reconstructing the motor phase voltages in the alpha-beta reference frame requires three PWM periods because all three motor phase voltages are required to be known.

Figure 9:
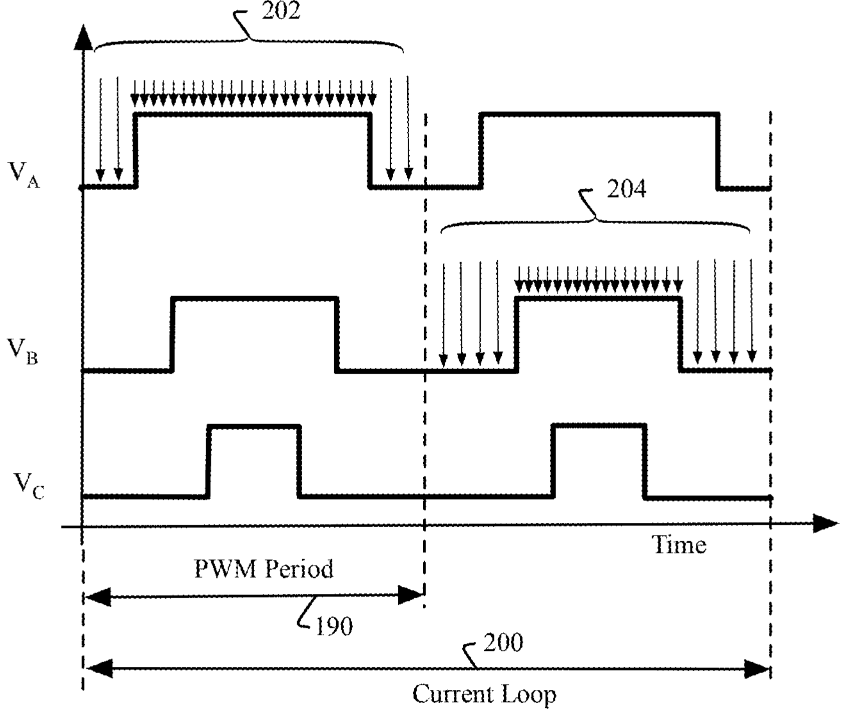
FIG. 9 is a graphical view of phase voltage sampling and averaging used with the embodiment of FIG. 2, in accordance with an embodiment of the present disclosure.

FIG. 9 with continued reference to FIG. 2 shows a method for oversampling of motor phase voltages Va 82 and Vb 84, then reconstructing Vc 86, in accordance with an embodiment of the present disclosure. As shown in FIG. 9, a current loop 200 is defined as including two consecutive PWM periods 190. In one current loop 200, the first motor phase voltage Va 82 may be selected with the multiplexer 104 and oversampled with a plurality of samples 202. In one embodiment, the plurality of samples 202 may then be averaged by an averaging function of the ADC 102. During the same current loop 200, the second motor phase voltage Vb 84 may be selected with the multiplexer 104 and oversampled with a plurality of samples 204. In one embodiment, the plurality of samples 204 may then be averaged by an averaging function of the ADC 102. Subsequently, the third motor phase voltage Vc 85 may then be reconstructed.

Figure 10:
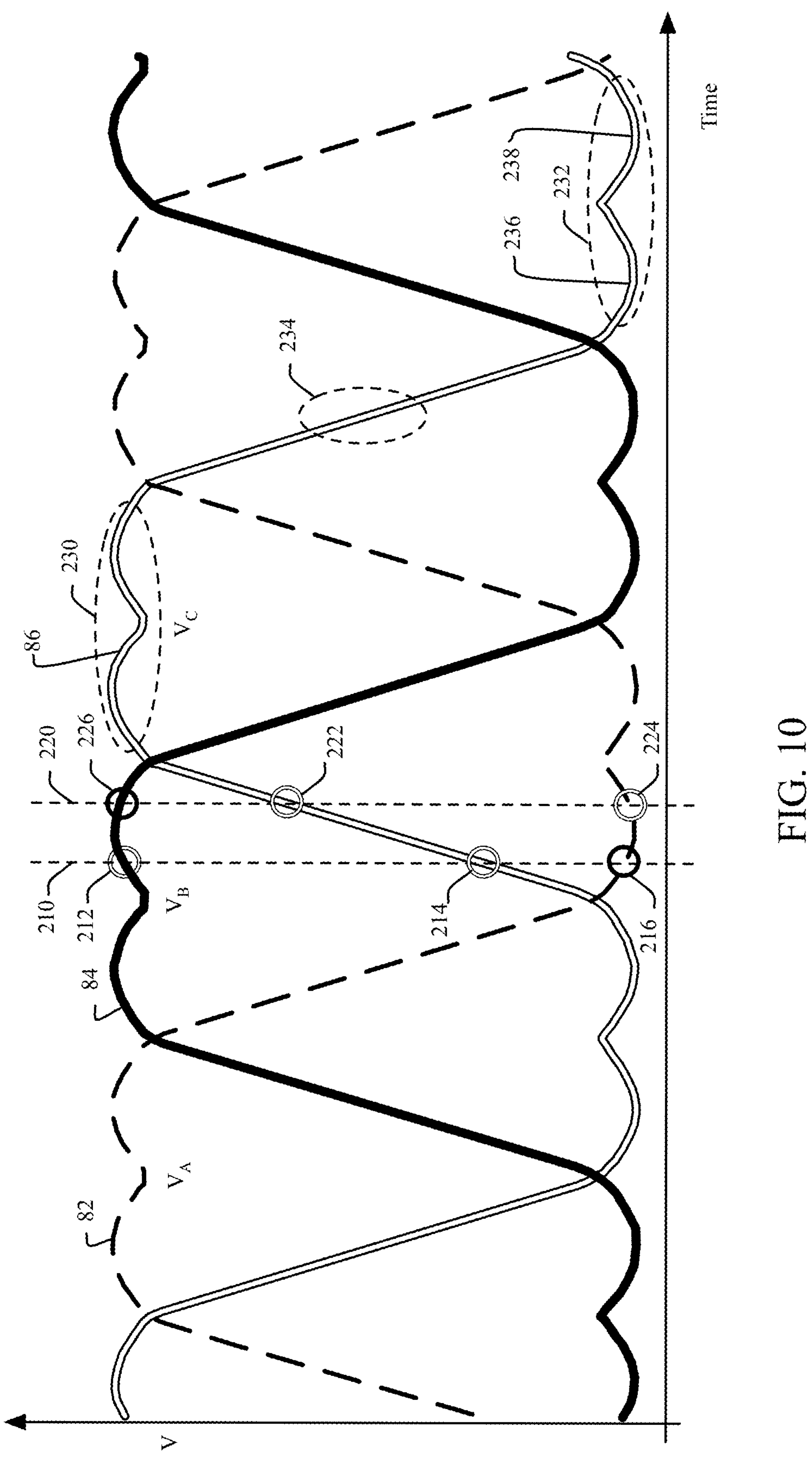
FIG. 10 is a graphical view of the phase voltages of a three-phase motor with examples of measured and reconstructed values, in accordance with an embodiment of the present disclosure.

FIG. 10 shows a graphical view of the motor phase voltages Va 82, Vb 84 and Vc 86 showing example measurement and reconstruction values for two current loops. In a first current loop 210, the second phase motor voltage Vb 84 is measured at point 212. The third phase motor voltage Vc 86 is measured at point 214. The remaining voltage (e.g., the first phase motor voltage Va 82 is then reconstructed at point 216. In the first current loop 210, the second phase motor voltage Vb 84 and the third phase motor voltage Vc 86 are consecutive. Similarly, in a second current loop 220, the third phase motor voltage Vc 86 is measured at point 222. The first phase motor voltage Va 82 is measured at point 224. The remaining voltage (e.g., the second phase motor voltage Vb 84 is then reconstructed at point 226. In the second current loop 220, the third phase motor voltage Vc 86 and the first phase motor voltage Va 82 are consecutive.

In each SVM 34 sector, one of the motor phase voltages rises or falls in a linear fashion, while the remaining two voltages form top curved waveform and a mirror image bottom curved waveform. For example, in FIG. 10, the region 230 includes a top curved waveform, the region 232 includes a bottom curved waveform and the region 234 shows a substantially linear waveform. In each current loop (e.g., the first current loop 210), the motor phase voltage that changes linearly is always measured (e.g., point 214). An adjacent top curved or bottom curved phase is measured (e.g. point 212), and the remaining phase is reconstructed (e.g. at point 216), in an alternating fashion. For example, in an odd current loop, one phase is calculated while another is reconstructed, then in an even current loop, the reconstructed phase is measured and the previously measured phase is reconstructed. Accordingly, in two consecutive current loops 210 and 220, all real phase voltages may be measured. In each current loop, all three phase voltages are either measured or reconstructed.

From the measured phase voltages 82, 84 and 86, and the DC bus voltage 90, the corresponding duty cycles may be calculated with the following equation [1]:

$$\text{DutyCycle\_Phase} = \text{V\_Phase\_measured}/\text{V\_DCBus} \quad [1]$$

Where "DutyCycle_Phase" is the corresponding duty cycle, "V_Phase_measured" is the measured motor phase voltage 82, 84 or 86, and "V_DCBus" is the DC bus voltage 90.

Reconstruction of the motor phase voltage forming the bottom curvature (e.g. region 232) may be calculated with the following equation [2]:

$$\text{DutyCycle\_BottomCurvature} = 1 - \text{DutyCycle\_TopCurvature} \quad [2]$$

Reconstructing the bottom curvature may be calculated from top curvature values which belong to the same time span. For example, while reconstructing the region 232 (phase voltage C 86) one has to use top curvature values belonging to the same region time-wise. For example, the first curve 236 in phase C voltage 86 of region 232 is reconstructed from the corresponding top curve of phase voltage A 82 and the second curve 238 in phase C voltage 86 of region 232 is reconstructed from the corresponding top curve of phase voltage B 84.

Reconstruction of the motor phase voltage forming the top curvature (e.g. region 230) may be calculated with the following equation [3], and follows a similar analysis to the reconstruction of the curves 236 and 238 of region 232:

$$\text{DutyCycle\_TopCurvature} = 1 - \text{DutyCycle\_BottomCurvature} \quad [3]$$

Subsequently, the three motor phase voltages, obtained either through measurement or reconstruction, are transformed into the alpha-beta reference frame and compared against the required alpha and beta motor voltages for each current loop 210 and 220.

Figure 11:
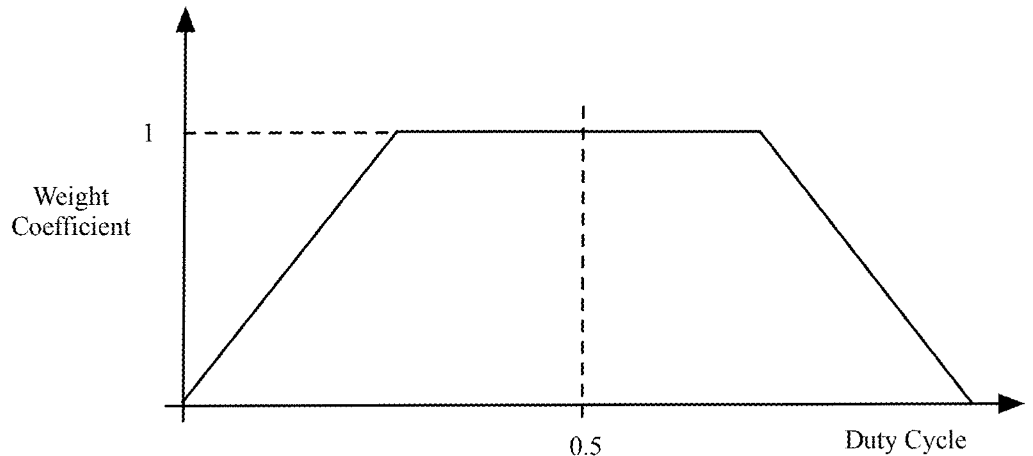
FIG. 11 is a graphical view of a transfer function used to calibrate a duty cycle induced error of the reconstructed phase voltage of FIG. 10, in accordance with an embodiment of the present disclosure.

FIG. 11 shows a transfer function used to compensate a duty cycle induced error of the reconstructed motor phase voltage of FIG. 10.

Since the oversampling and averaging functionality introduces a duty cycle related error (e.g., a finite amount of voltage samples have a direct impact on measurement resolution and average voltage value accuracy), for better accuracy of the reconstructed voltage it may be beneficial to compensate for the aforementioned error.

During a calibration phase of the embodiment 10 of FIG. 1, there is a 50% duty cycle applied to all motor phases, which results into measured average phase voltage equal to 50% of DC bus voltage 90. The offset is determined with equation [4] below.

$$\text{Offset} = 0.5 - PhaseVoltageRaw/\text{Voltage\_DCBus\_at\_50}percent \quad [4]$$

Where "Phase VoltageRaw" is the uncorrected phase voltage, and "Voltage_DCBus_at_50percent" is the DC bus voltage 90 measured at a 50% duty cycle. The offset is then subtracted from the measured average phase voltages during the voltage reconstruction in accordance with equation [5] below.

$$PhaseVoltageAverageMeasured = PhaseVoltageRaw - WeightCoeff \times \text{Offset} \quad [5]$$

Where "Phase VoltageAverageMeasured" is the oversampled phase voltage after averaging, "WeightCoeff" is determined from the transfer function of FIG. 11. Since at high or low duty cycles the accuracy of the measurement causes the average value to be rounded upwards, (or downwards respectively), due to the finite resolution of oversampling and there is no need for the compensation for duty cycles closer to 50%, A better accuracy of the reconstruction is obtained when the impact of the offset compensation is suppressed by the weight coefficient, (e.g., the closer to high or low duty cycles, the lower weight coefficient), as per the equation [5].

Figure 12:
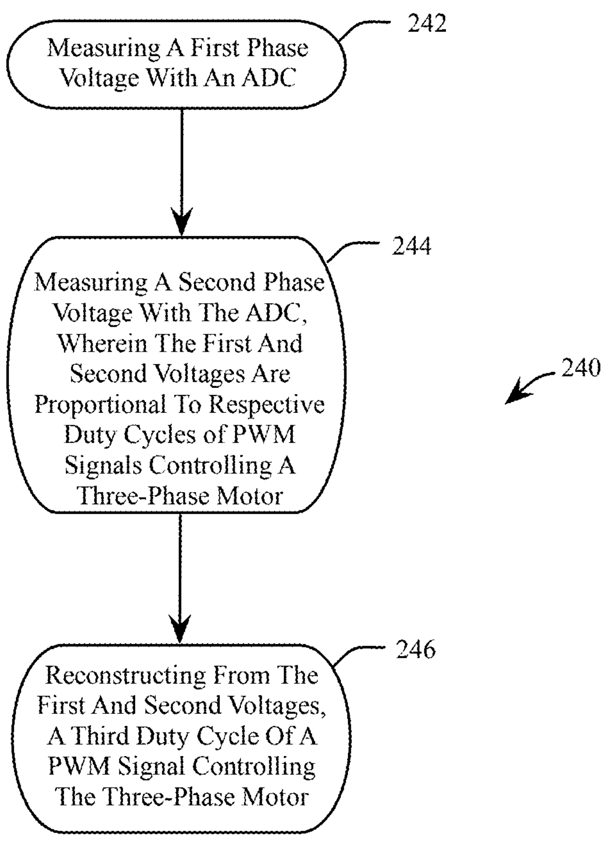
FIG. 12 is a flowchart representation of a method for motor voltage reconstruction by Analog to Digital Converter (ADC) oversampling and averaging, in accordance with an embodiment of the present disclosure.

FIG. 12 shows an embodiment 240 of a method of motor voltage reconstruction by ADC oversampling and averaging. With continued reference to FIG. 1, FIG. 2, FIG. 10 and FIG. 12, at 242 a first phase voltage (e.g. Va 82, Vb 84 or Vc 86) is measured with an ADC 102. At 244, a second phase voltage (e.g., Vb 84, Vc 86 or Va 82 respectively) is measured with the ADC 102, wherein the first and second phase voltages are proportional to respective duty cycles of PWM signals (e.g., equation [1]) controlling a three-phase motor 12. At 246, a third duty cycle of a PWM controlling the three-phase motor 12 is reconstructed (e.g., derived from Vc 86, Va 82 or Vb 84 respectively).

Figure 13:
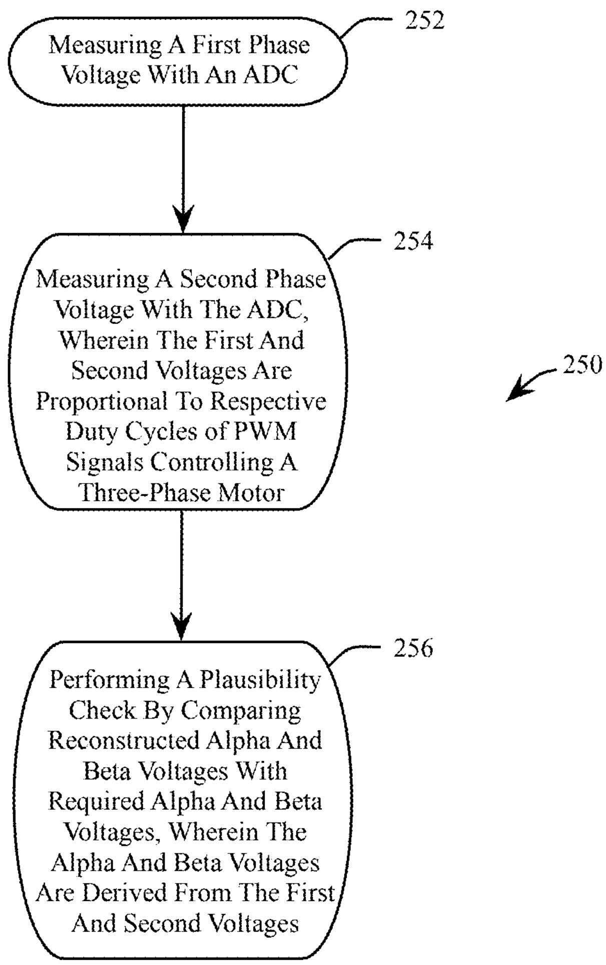
FIG. 13 is a flowchart representation of another method for motor voltage reconstruction by Analog to Digital Converter (ADC) oversampling and averaging, in accordance with an embodiment of the present disclosure.

FIG. 13 shows an embodiment 250 of a method of motor voltage reconstruction by ADC oversampling and averaging. With continued reference to FIG. 1, FIG. 2, FIG. 10 and FIG. 13, at 252 a first phase voltage (e.g. Va 82, Vb 84 or Vc 86) is measured with an ADC 102. At 254, a second phase voltage (e.g., Vb 84, Vc 86 or Va 82 respectively) is measured with the ADC 102, wherein the first and second phase voltages are proportional to respective duty cycles of PWM signals (e.g., equation [1]) controlling a three-phase motor 12. At 256, a plausibility check is performed (with the plausibility condition circuit 136), by comparing reconstructed alpha and beta voltages 132 and 134 with required alpha and beta voltages 40 and 42.

Figure 14:
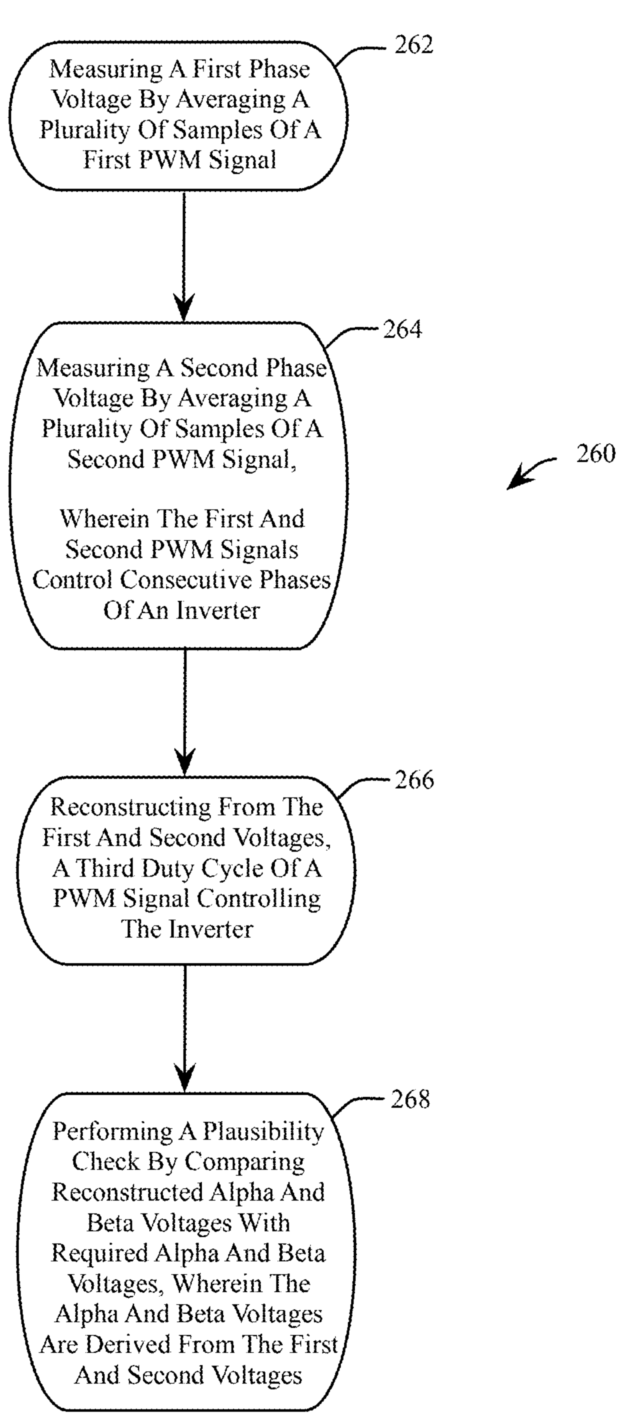
FIG. 14 is a flowchart representation of another method for motor voltage reconstruction by Analog to Digital Converter (ADC) oversampling and averaging, in accordance with an embodiment of the present disclosure.

FIG. 14 shows an embodiment 260 of a method of motor voltage reconstruction by ADC oversampling and averaging. With continued reference to FIG. 1, FIG. 2, FIG. 10 and FIG. 14, at 262 a first phase voltage (e.g. Va 82, Vb 84 or Vc 86) is measured by averaging a plurality of samples of a first PWM signal. At 264, a second phase voltage (e.g., Vb 84, Vc 86 or Va 82 respectively) is measured by averaging a plurality of samples of a second PWM signal, wherein the first and second phase voltages control consecutive phases of an inverter 20. At 266, a third duty cycle of a PWM controlling the inverter 20 is reconstructed (e.g., derived from Vc 86, Va 82 or Vb 84 respectively). At 268, a plausibility check is performed (with the plausibility condition circuit 136), by comparing reconstructed alpha and beta voltages 132 and 134 with required alpha and beta voltages 40 and 42.

As will be appreciated, at least some of the embodiments as disclosed include at least the following. In one embodiment, a method for motor voltage reconstruction by Analog to Digital Converter (ADC) oversampling and averaging comprises measuring a first phase voltage with an ADC, the first phase voltage proportional to a first duty cycle of a first Pulse Width Modulation (PWM) signal. A second phase voltage is measured with the ADC, the second phase voltage proportional to a second duty cycle of a second PWM signal, wherein the first PWM signal and the second PWM signal control consecutive phases of a three-phase motor. A third duty cycle of a third PWM signal of the three-phase motor is reconstructing from the first phase voltage and the second phase voltage.

Alternative embodiments of the method for motor voltage reconstruction by Analog to Digital Converter (ADC) oversampling and averaging include one of the following features, or any combination thereof. The ADC is multiplexed to select one of the first phase voltage and the second phase voltage. Measuring the first phase voltage comprises averaging a plurality of first voltage samples of the first PWM signal and measuring the second phase voltage comprises averaging a plurality of second voltage samples of the second PWM signal. Determining the first duty cycle comprises dividing the first phase voltage by a Direct Current (DC) bus voltage and determining the second duty cycle comprises dividing the second phase voltage by the DC bus voltage, wherein the DC bus voltage supplies power to an inverter configured to control the three-phase motor. Reconstructing the third duty cycle comprises one of subtracting from a unity value the first duty cycle when the second phase voltage is changing linearly and subtracting from the unity value the second duty cycle when the first phase voltage is changing linearly. Transforming the first phase voltage, the second phase voltage and a third phase voltage to a reconstructed alpha voltage and a reconstructed beta voltage in an alpha-beta reference frame with a Clarke transform, wherein the third phase voltage is determined from the third duty cycle multiplied by the DC bus voltage. A plausibility check is performed by comparing each of a reconstructed alpha voltage and a reconstructed beta voltage to a corresponding required alpha voltage and a required beta voltage. The DC bus voltage is sampled with a second ADC. A weighted offset is subtracted from each of the first phase voltage and the second phase voltage, wherein the weighted offset varies with the respective first duty cycle and second duty cycle. Each of the first phase voltage and the second phase voltage are measured with less than three shunts coupled to the three-phase motor for current measurement.

In another embodiment, a method for motor voltage reconstruction by Analog to Digital Converter (ADC) oversampling and averaging comprises measuring a first phase voltage with an ADC, the first phase voltage proportional to a first duty cycle of a first Pulse Width Modulation (PWM) signal. A second phase voltage is measured with the ADC, the second phase voltage proportional to a second duty cycle of a second PWM signal, wherein the first PWM signal and the second PWM signal control consecutive phases of a three-phase motor. A plausibility check is performed by comparing each of a reconstructed alpha voltage and reconstructed beta voltage to a corresponding required alpha voltage and a required beta voltage, wherein the reconstructed alpha voltage and the reconstructed beta voltage are derived from the first phase voltage and the second phase voltage.

Alternative embodiments of the method for motor voltage reconstruction by Analog to Digital Converter (ADC) oversampling and averaging include one of the following features, or any combination thereof. The reconstructed alpha voltage and the reconstructed beta voltage are derived with a Clarke transform of the first phase voltage, the second phase voltage and a third phase voltage, wherein the third phase voltage is determined from a third duty cycle multiplied by a Direct Current (DC) bus voltage, wherein the DC bus voltage supplies power to an inverter configured to control the three-phase motor. The third duty cycle is reconstructed by subtracting from a unity value the first duty cycle when the second phase voltage is changing linearly and subtracting from the unity value the second duty cycle when the first phase voltage is changing linearly. The DC bus voltage is sampled with a second ADC. A weighted offset is subtracted from each of the first phase voltage and the second phase voltage, wherein the weighted offset varies with the respective first duty cycle and second duty cycle.

In another embodiment, a method for motor voltage reconstruction by Analog to Digital Converter (ADC) oversampling and averaging comprises measuring a first phase voltage proportional to a first duty cycle by averaging a plurality of first phase voltage samples of a first Pulse Width Modulation (PWM) signal. A second phase voltage is measured proportional to a second duty cycle by averaging a plurality of second phase voltage samples of a second PWM signal, wherein the first PWM signal and the second PWM signal control consecutive phases of an inverter. A third duty cycle of a third PWM signal of the inverter is reconstructed from the first phase voltage and the second phase voltage. A plausibility check is performed by comparing each of a reconstructed alpha voltage and a reconstructed beta voltage to a corresponding required alpha voltage and a required beta voltage, wherein the reconstructed alpha voltage and the reconstructed beta voltage are derived from the first phase voltage and the second phase voltage.

Alternative embodiments of the method for motor voltage reconstruction by Analog to Digital Converter (ADC) oversampling and averaging include one of the following features, or any combination thereof. A third phase voltage is determined by multiplying the third duty cycle by a Direct Current (DC) bus voltage, wherein the DC bus voltage supplies power to the inverter configured to control a three-phase motor. The first phase voltage, the second phase voltage and the third phase voltage are transformed to a reconstructed alpha voltage and a reconstructed beta voltage in an alpha-beta reference frame with a Clarke transform. Reconstructing the third duty cycle comprises one of subtracting from a unity value the first duty cycle when the second phase voltage is changing linearly and subtracting from the unity value the second duty cycle when the first phase voltage is changing linearly. A weighted offset is subtracted from each of the first phase voltage and the second phase voltage, wherein the weighted offset varies with the respective first duty cycle and second duty cycle.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as “first” and “second” are used to arbitrarily distinguish between the elements such terms describe. Thus, these terms are not necessarily intended to indicate temporal or other prioritization of such elements.

What is claimed is:

1. A method for motor voltage reconstruction by Analog to Digital Converter (ADC) oversampling and averaging comprising:

measuring a first phase voltage with an ADC, the first phase voltage proportional to a first duty cycle of a first Pulse Width Modulation (PWM) signal;

measuring a second phase voltage with the ADC, the second phase voltage proportional to a second duty cycle of a second PWM signal, wherein the first PWM signal and the second PWM signal control consecutive phases of a three-phase motor; and reconstructing from the first phase voltage and the second phase voltage, a third duty cycle of a third PWM signal of the three-phase motor.

2. The method of claim 1 further comprising multiplexing the ADC to select one of the first phase voltage and the second phase voltage.

3. The method of claim 1 wherein measuring the first phase voltage comprises averaging a plurality of first voltage samples of the first PWM signal and measuring the second phase voltage comprises averaging a plurality of second voltage samples of the second PWM signal.

4. The method of claim 1 wherein determining the first duty cycle comprises dividing the first phase voltage by a Direct Current (DC) bus voltage and determining the second duty cycle comprises dividing the second phase voltage by the DC bus voltage, wherein the DC bus voltage supplies power to an inverter configured to control the three-phase motor.

5. The method of claim 4 wherein reconstructing the third duty cycle comprises one of subtracting from a unity value the first duty cycle when the second phase voltage is changing linearly and subtracting from the unity value the second duty cycle when the first phase voltage is changing linearly.

6. The method of claim 5 further comprising transforming the first phase voltage, the second phase voltage and a third phase voltage to a reconstructed alpha voltage and a reconstructed beta voltage in an alpha-beta reference frame with a Clarke transform, wherein the third phase voltage is determined from the third duty cycle multiplied by the DC bus voltage.

7. The method of claim 6 further comprising performing a plausibility check by comparing each of a reconstructed alpha voltage and a reconstructed beta voltage to a corresponding required alpha voltage and a required beta voltage.

8. The method of claim 1 further comprising sampling the DC bus voltage with a second ADC.

9. The method of claim 1 further comprising subtracting from each of the first phase voltage and the second phase voltage a weighted offset, wherein the weighted offset varies with the respective first duty cycle and second duty cycle.

10. The method of claim 1 wherein each of the first phase voltage and the second phase voltage are measured with less than three shunts coupled to the three-phase motor for current measurement.

11. A method for motor voltage reconstruction by Analog to Digital Converter (ADC) oversampling and averaging comprising:

measuring a first phase voltage with an ADC, the first phase voltage proportional to a first duty cycle of a first Pulse Width Modulation (PWM) signal;

measuring a second phase voltage with the ADC, the second phase voltage proportional to a second duty cycle of a second PWM signal, wherein the first PWM signal and the second PWM signal control consecutive phases of a three-phase motor; and performing a plausibility check by comparing each of a reconstructed alpha voltage and reconstructed beta voltage to a corresponding required alpha voltage and a required beta voltage, wherein the reconstructed alpha voltage and the reconstructed beta voltage are derived from the first phase voltage and the second phase voltage.

12. The method of claim 11 wherein the reconstructed alpha voltage and the reconstructed beta voltage are derived with a Clarke transform of the first phase voltage, the second phase voltage and a third phase voltage, wherein the third phase voltage is determined from a third duty cycle multiplied by a Direct Current (DC) bus voltage, wherein the DC bus voltage supplies power to an inverter configured to control the three-phase motor.

13. The method of claim 12 wherein the third duty cycle is reconstructed by subtracting from a unity value the first duty cycle when the second phase voltage is changing linearly and subtracting from the unity value the second duty cycle when the first phase voltage is changing linearly.

14. The method of claim 11 further comprising sampling the DC bus voltage with a second ADC.

15. The method of claim 11 further comprising subtracting from each of the first phase voltage and the second phase voltage a weighted offset, wherein the weighted offset varies with the respective first duty cycle and second duty cycle.

16. A method for motor voltage reconstruction by Analog to Digital Converter (ADC) oversampling and averaging comprising:

measuring a first phase voltage proportional to a first duty cycle by averaging a plurality of first phase voltage samples of a first Pulse Width Modulation (PWM) signal, measuring a second phase voltage proportional to a second duty cycle by averaging a plurality of second phase voltage samples of a second PWM signal, wherein the first PWM signal and the second PWM signal control consecutive phases of an inverter;

reconstructing from the first phase voltage and the second phase voltage, a third duty cycle of a third PWM signal of the inverter; and performing a plausibility check by comparing each of a reconstructed alpha voltage and a reconstructed beta voltage to a corresponding required alpha voltage and a required beta voltage, wherein the reconstructed alpha voltage and the reconstructed beta voltage are derived from the first phase voltage and the second phase voltage.

17. The method of claim 16 further comprising determining a third phase voltage by multiplying the third duty cycle by a Direct Current (DC) bus voltage, wherein the DC bus voltage supplies power to the inverter configured to control a three-phase motor.

18. The method of claim 17 further comprising transforming the first phase voltage, the second phase voltage and the third phase voltage to a reconstructed alpha voltage and a reconstructed beta voltage in an alpha-beta reference frame with a Clarke transform.

19. The method of claim 16 wherein reconstructing the third duty cycle comprises one of subtracting from a unity value the first duty cycle when the second phase voltage is changing linearly and subtracting from the unity value the second duty cycle when the first phase voltage is changing linearly.

20. The method of claim 16 further comprising subtracting from each of the first phase voltage and the second phase voltage a weighted offset, wherein the weighted offset varies with the respective first duty cycle and second duty cycle.

* * * * *